United States Patent [19]

Huang

[11] Patent Number: 5,998,252

[45] Date of Patent: *Dec. 7, 1999

[54] METHOD OF SALICIDE AND SAC (SELF-ALIGNED CONTACT) INTEGRATION

[75] Inventor: Jenn Ming Huang, Hsin-Chu, Taiwan

[73] Assignee: Taiwan Semiconductor Manufacturing Company, Ltd., Hsin-Chu, Taiwan

[*] Notice: This patent is subject to a terminal disclaimer.

[21] Appl. No.: 08/998,630

[22] Filed: Dec. 29, 1997

[51] Int. Cl.$^6$ .................................................. H01L 21/8241
[52] U.S. Cl. .......................... 438/241; 438/258; 438/682
[58] Field of Search .................................... 438/396, 586, 438/970, 241, 258, 592, 682

[56] References Cited

U.S. PATENT DOCUMENTS

| | | | |
|---|---|---|---|
| 5,134,083 | 7/1992 | Matthews | 437/40 |
| 5,397,722 | 3/1995 | Bashir et al. | 437/41 |
| 5,573,980 | 11/1996 | Yoo | 437/200 |
| 5,668,035 | 9/1997 | Fang et al. | 438/239 |

OTHER PUBLICATIONS

S. Wolf, "Silicon Processing for the VLSI Era" vol. 2, Lattice Press, Sunset Beach, CA, 1990, pp. 144–149.
VLSI Technology, 2$^{nd}$ Edition, SMSZE, McGraw–Hill, New York, NY, 1988, pp. 397–400, 479–483.

Primary Examiner—John F. Niebling
Assistant Examiner—Christopher Lattin
Attorney, Agent, or Firm—George O. Saile; Stephen B. Ackerman; Rosemary L. S. Pike

[57] ABSTRACT

A method for integrating salicide and self-aligned contact processes in the fabrication of logic circuits with embedded memory is achieved. Field oxide areas are formed to isolate a logic device area and a memory device area. A gate oxide layer, first polysilicon layer, silicon oxide layer and silicon nitride layer are deposited over the substrate. The silicon nitride layer is selectively removed in the logic device area. The layers in the memory device area are patterned to form memory devices. The layers in the logic device area are patterned to form gate electrodes. Silicon nitride spacers are formed on the sidewalls of the gate electrodes and memory devices and associated source and drain regions are formed within the substrate. The substrate is covered with a resist protective oxide which is removed in the logic device area. A layer of titanium is deposited over the substrate and transformed by annealing into a titanium silicide layer over the gate electrodes and associated source and drain regions. The unreacted titanium layer overlying the spacers, field oxide, and resist protective oxide layer is removed. An insulating layer is deposited over the substrate. A self-aligned contact opening is formed in the memory device area through the insulating layer between two of the memory devices to one of the associated source and drain regions. A second polysilicon layer is deposited over the substrate and within the self-aligned contact opening and patterned to complete the self-aligned contact.

15 Claims, 8 Drawing Sheets

METHOD OF SALICIDE AND SAC (SELF-ALIGNED CONTACT) INTEGRATION

BACKGROUND OF THE INVENTION (1) Field of the Invention

The present invention relates to the fabrication of integrated circuit devices, and more particularly, to a method of integrating salicide and self-aligned contact processes in the fabrication of integrated circuits.

(2) Description of the Prior Art

In the fabrication of integrated circuit devices, logic products are often produced using salicide (self-aligned silicide) processes in order to obtain higher circuit performance. In silicidation, a refractory metal layer is deposited and then annealed. The underlying silicon reacts with the refractory metal layer to produce a silicide overlying the gate electrode and source and drain regions. The silicided gate and source/drain regions have lower resistance than non-silicided regions, especially in smaller geometries, and hence, higher circuit performance.

In the production of memory units, the self-aligned contact (SAC) has been widely used to reduce cell size. With the advent of Large Scale Integration (LSI) many of the integrated circuits formed on semiconductor substrates comprise several circuit functions on a single chip. For example, memory devices are formed on the same chip as the logic circuits which address them. It is desired to find a method of integrating the salicide and the SAC processes on one wafer so that both high logic performance and high density memory for embedded memory can be achieved.

Silicidation has been widely used in the art. Silicidation techniques and self-aligned contacts are discussed in *Silicon Processing for the VLSI Era*, Vol. 2, by S. Wolf, Lattice Press, Sunset Beach, Calif., c. 1990, pp. 144–149 and in *VLSI Technology*, Second Edition by S. M. Sze, McGraw-Hill, New York, N.Y., c. 1988, pp.397–400 and 479–483. U.S. Pat. No. 5,668,035 to Fang et al shows a method of forming a dual gate oxide for a memory having embedded logic wherein silicide is formed in both areas. U.S. Pat. No. 5,397,722 to Bashir et al teaches self-aligned source/drain polysilicon or polycide contacts. U.S. Pat. No. 5,573,980 to Yoo teaches a silicided self-aligned contact for SRAM cells, but with no embedded logic. U.S. Pat. No. 5,134,083 to Matthews teaches a BiCMOS device with self-aligned contacts.

SUMMARY OF THE INVENTION

Accordingly, it is a primary object of the present invention to provide an effective and very manufacturable method for integrating salicide and self-aligned contact processes in the fabrication of integrated circuits.

It is a further object of the invention to provide a process for integrating salicide and self-aligned contact processes in the fabrication of logic circuits with embedded memory.

Yet another object is to form salicided gate and source/drain regions in the logic circuits of an integrated circuit device while also forming self-aligned contacts in the memory circuits of the same integrated circuit device.

In accordance with the objects of the invention, a method for integrating salicide and self-aligned contact processes in the fabrication of logic circuits with embedded memory is achieved. Field oxide areas are formed on a semiconductor substrate surrounding and electrically isolating device areas which include a logic device area and a memory device area. A gate oxide layer is provided in the device areas. A first polysilicon layer is deposited overlying the gate oxide layer and the field oxide areas. A layer of silicon oxide is deposited overlying the polysilicon layer. A silicon nitride layer is deposited overlying the silicon oxide layer. The silicon nitride layer is selectively removed in the logic device area. The silicon nitride layer, silicon oxide layer, polysilicon layer, and gate oxide layer in the memory device area are patterned to form memory devices. The first polysilicon layer and the gate oxide layer in the logic device area are patterned to form gate electrodes. First ions are implanted to form lightly doped source and drain regions within the semiconductor substrate associated with the memory devices and the gate electrodes. Silicon nitride spacers are formed on the sidewalls of the gate electrodes and memory devices. Second ions are implanted to form heavily doped source and drain regions within the semiconductor substrate associated with the gate electrodes and memory devices. The gate electrodes and memory devices are covered with a layer of resist protective oxide. The resist protective oxide layer is removed within the logic device area. A layer of titanium is deposited over the semiconductor substrate. The substrate is annealed whereby the titanium layer is transformed into a titanium silicide layer over the gate electrodes and over the heavily doped source and drain regions associated with the gate electrodes. The titanium layer which is not transformed into titanium silicide overlying the spacers, the field oxide regions, and the resist protective oxide layer is removed to leave the titanium silicide layer only on the top surface of the gate electrodes and on the top surface of the semiconductor substrate overlying the heavily doped source and drain regions associated with the gate electrodes. An insulating layer is deposited over the surface of the semiconductor substrate. A self-aligned contact opening is formed in the memory device area through the insulating layer and the resist protective oxide layer between two of the memory devices to one of the heavily doped source and drain regions associated with the memory devices. A second polysilicon layer is deposited over the semiconductor substrate and within the self-aligned contact opening and patterned to complete the self-aligned contact completing the fabrication of the integrated circuit device.

BRIEF DESCRIPTION OF THE DRAWINGS

In the accompanying drawings forming a material part of this description, there is shown.

DESCRIPTION OF THE PREFERRED EMBODIMENTS

Figure 1:
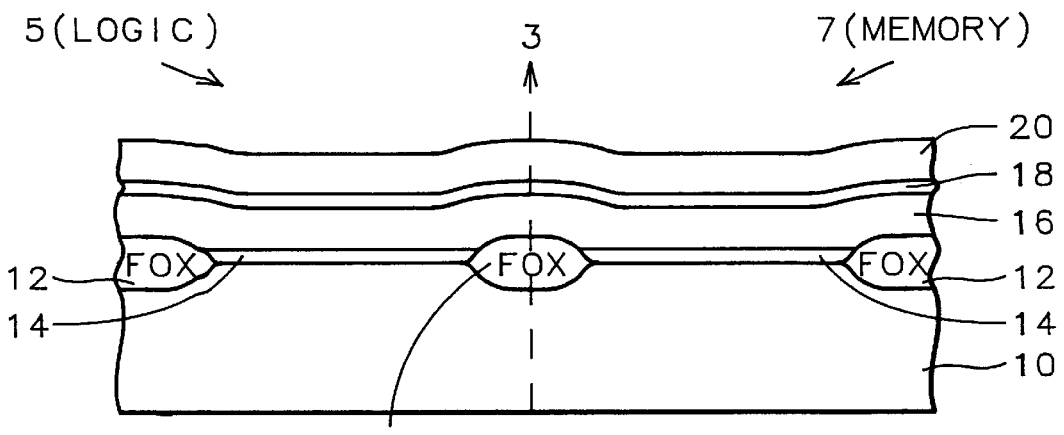
FIGS. 1 through 15 are cross-sectional representations of a preferred embodiment of the present invention.

Referring now more particularly to FIG. 1, there is shown a semiconductor substrate 10, preferably composed of monocrystalline silicon. Field OXide regions 12 may be formed as is conventional in the art. The substrate is shown to be divided by dashed line 3 into a logic side 5 on the left and a memory side 7 on the right. The chip is depicted in this way for clarity. It is to be understood that the chip layout can be other than that depicted. The important point is that both logic and memory devices are to be fabricated on the same wafer.

First, a layer of gate oxide 14 is grown over the surface of the substrate, typically to a thickness of between about 40 and 100 Angstroms. A layer of polysilicon 16 is deposited over the gate oxide and field oxide regions to a thickness of between about 1000 and 3000 Angstroms. A thin layer of silicon oxide 18 is deposited or grown over the surface of the polysilicon layer 16 to a thickness of between about 100 and 500 Angstroms. Next, a layer of silicon nitride 20 is deposited over the thin oxide layer to a thickness of between about 1000 and 2000 Angstroms.

Figure 2:
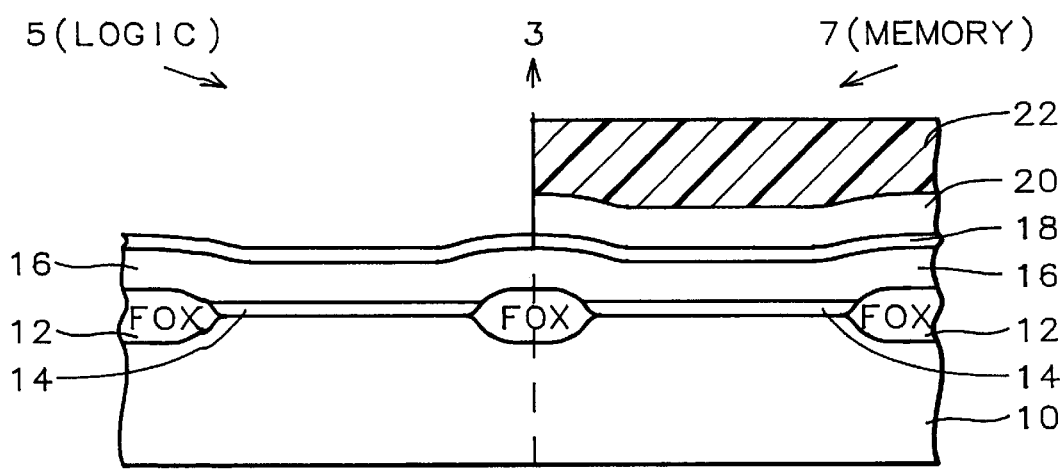

Referring now to FIG. 2, a layer of photoresist is coated over the substrate, and exposed, developed, and patterned to form the photoresist mask 22 covering the memory side of the wafer. The silicon nitride layer 20 in the logic area is etched away. The photoresist mask and, optionally, the silicon oxide layer 18 are removed.

Figure 3:
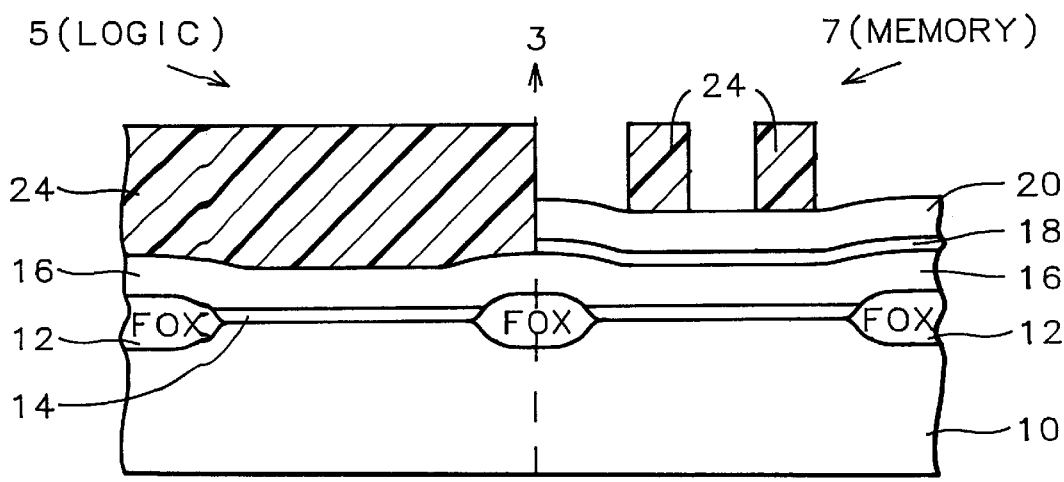
Figure 4:
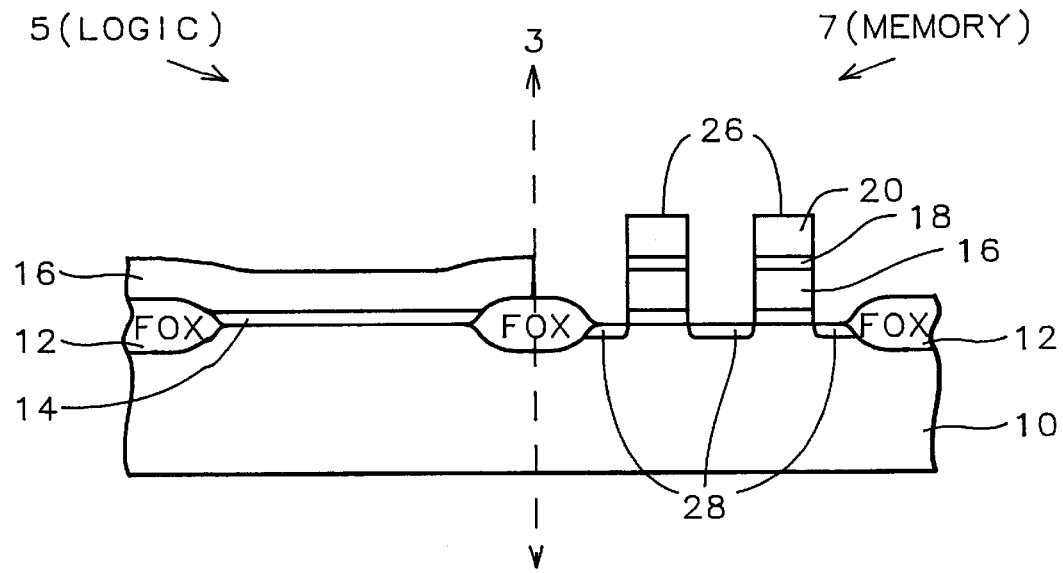

Next, a photoresist mask 24 is formed over the substrate to define the memory devices. The mask also completely covers the logic portion of the wafer, as shown in FIG. 3. The silicon nitride, silicon oxide, polysilicon, and gate oxide layers are etched away where they are not covered by the mask 24 to form the memory devices 26, as shown in FIG. 4. The memory devices 26 may be word lines in a dynamic random access memory (DRAM) cell or pass-gate or pull-down transistors in a static random access memory (SRAM) cell. Optionally, an LDD implant may be made at this time to form lightly doped regions 28.

Figure 5:
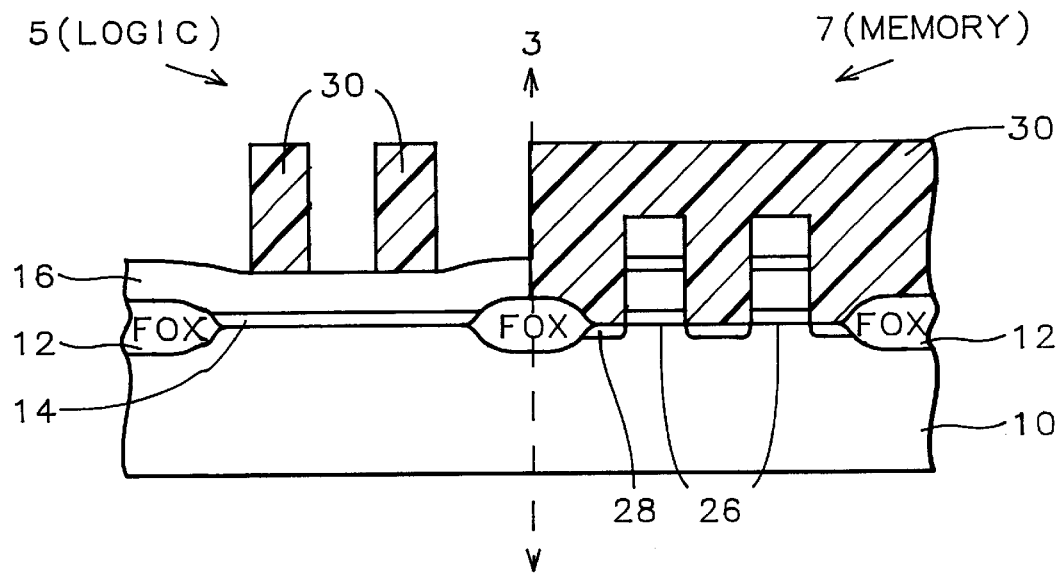
Figure 6:
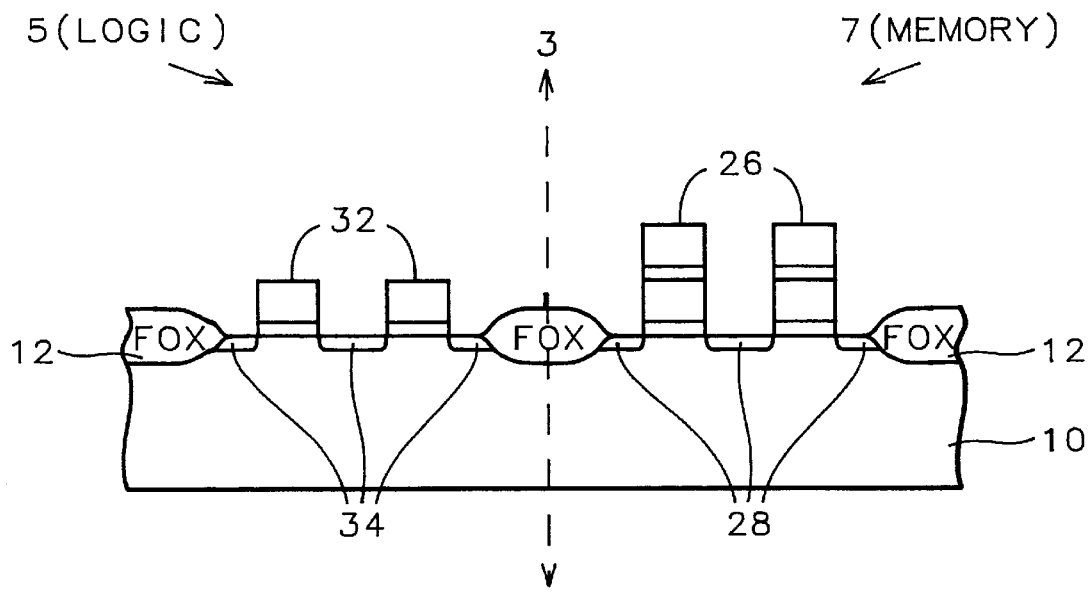

Referring now to FIG. 5, a photoresist mask 30 is formed over the substrate to define the logic devices. The mask also completely covers the memory side 7 of the wafer. The polysilicon layer 16 is etched away where it is not covered by the mask 30 to form the gate electrodes 32, as illustrated in FIG. 6. The LDD implant to form the transistor lightly doped regions 34 is performed at this time. Both NLDD and PLDD regions are formed using appropriate photomasking, as is conventional.

Figure 7:
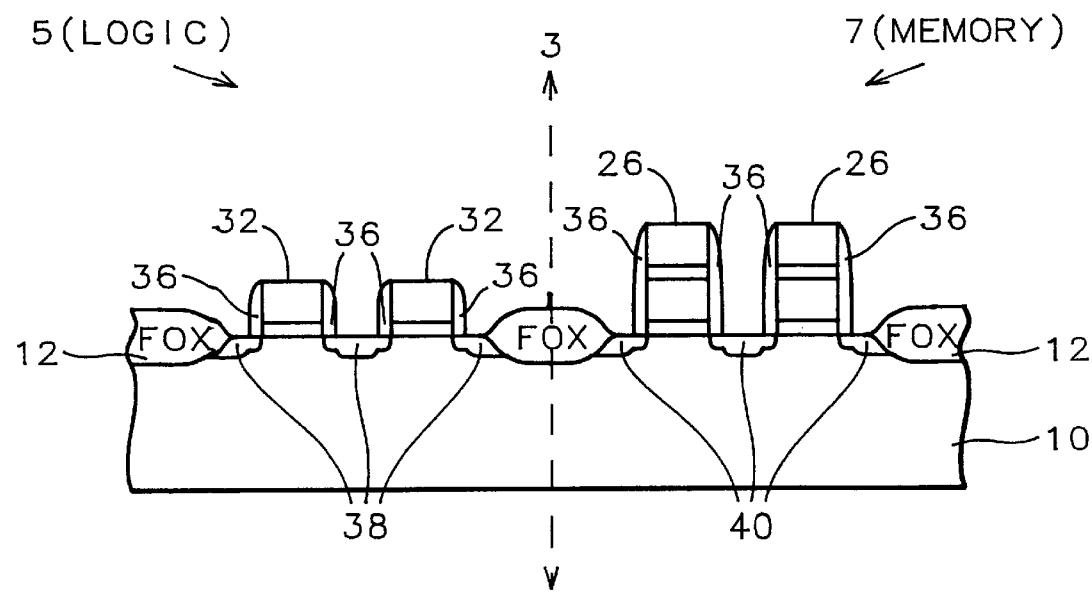

Referring now to FIG. 7, a second layer of silicon nitride is deposited over the surface of the substrate and anisotropically etched back to leave silicon nitride spacers 36 on the sidewalls of the gate electrodes 32 and the memory devices 26. Ion implantations are performed to form heavily doped source and drain regions 38 and 40. Source/drain regions 38 in the logic area will be N+ or P+ regions for NMOS and PMOS. Source/drain regions 40 in the memory area should be N-type regions.

Figure 8:
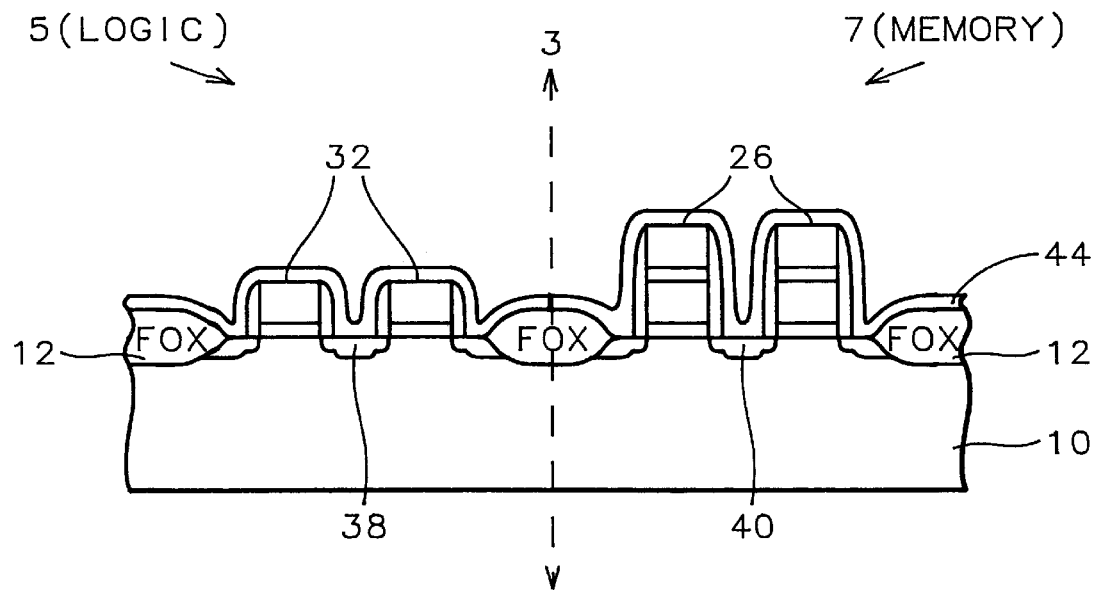
Figure 9:
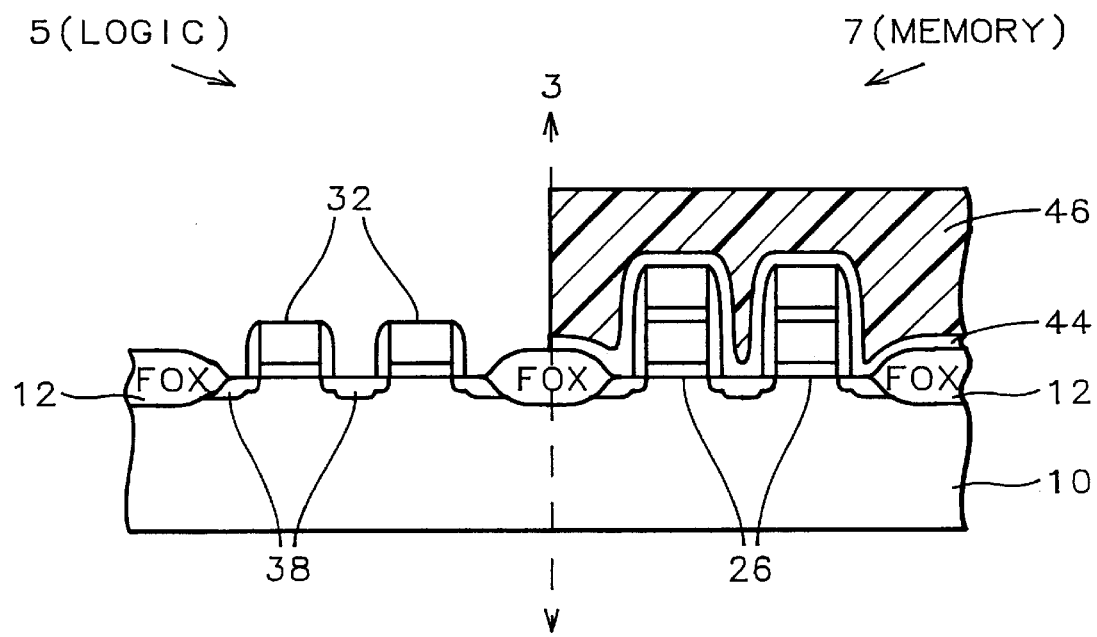

Referring now to FIG. 8, a layer of resist protection oxide (RPO) 44 is deposited over the surface of the substrate to a thickness of between about 200 and 400 Angstroms. A photoresist mask 46 is formed over the memory side 7 of the wafer. The RPO layer 44 is etched away on the logic side 5 of the wafer where it is not covered by the photoresist mask 46, as shown in FIG. 9.

RPO is used typically in logic processes to prevent silicidation in certain areas; for example, high resistor elements, ESD devices, input/output (I/O) circuits, etc. Here, the RPO layer 44 is used to protect the memory cells from silicidation.

Figure 10:
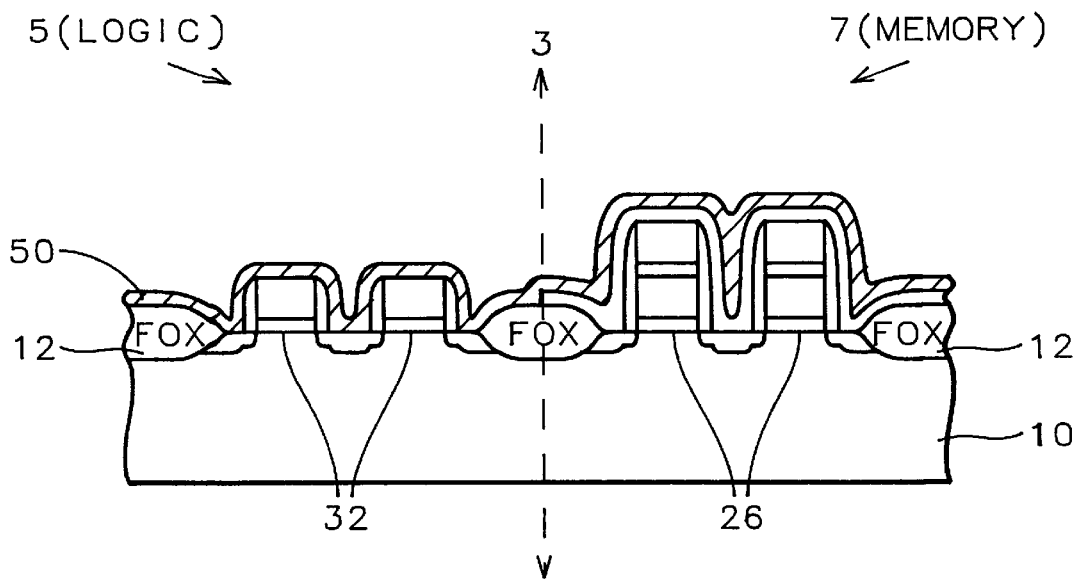

Referring now to FIG. 10, a titanium, titanium nitride, titanium/titanium nitride, or the like, layer 50 is deposited over the surface of the substrate, typically by sputtering, to a thickness of between about 200 and 500 Angstroms.

Figure 11:
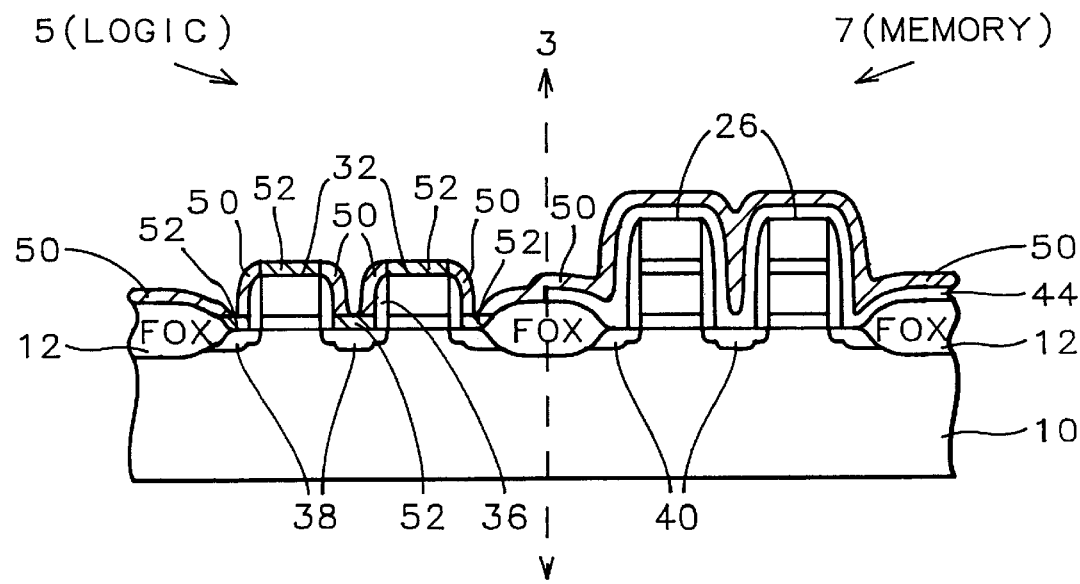

The substrate is annealed, for example, using a rapid thermal anneal (RTA) in a nitrogen ambient at a temperature of 650 to 750° C. for 10 to 30 seconds. The titanium layer 50 reacts with the silicon in the substrate in the source and drain regions 38 and with the polysilicon in the gate electrode 32 to form titanium silicide 52. The titanium overlying the field oxide regions 12, the silicon nitride sidewalls 36, and the RPO layer 44 is unchanged, as illustrated in FIG. 11.

Figure 12:
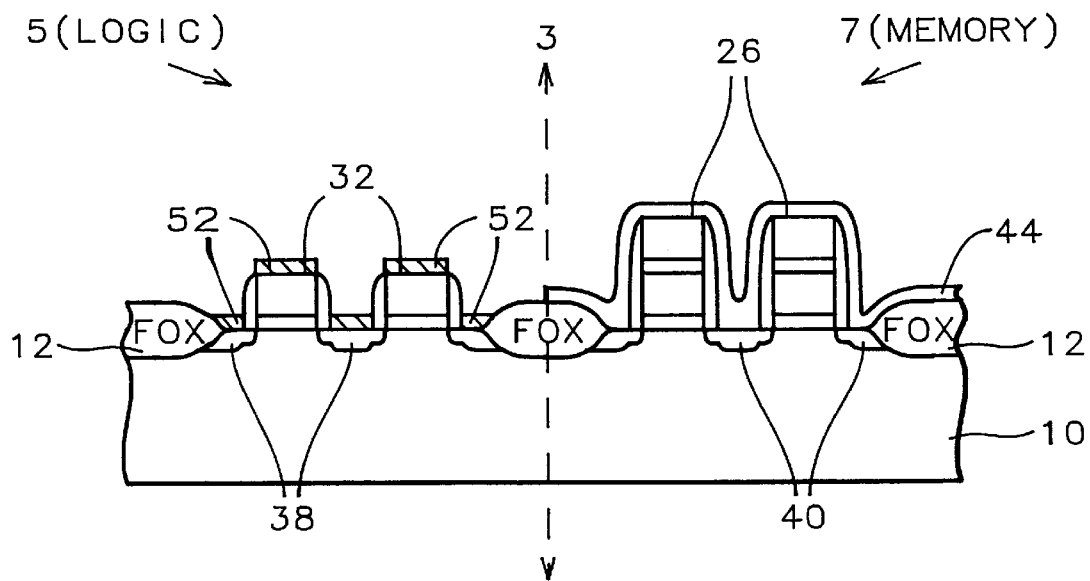

Referring now to FIG. 12, the unreacted titanium 50 is removed, leaving the salicided gate electrodes 32 and source and drain regions 38 in the logic area 5. Next, a second RTA is performed, for example, at a temperature of 800 to 900° C. for 10 to 30 seconds to convert the titanium silicide 52 into a phase which has lower resistance.

Figure 13:
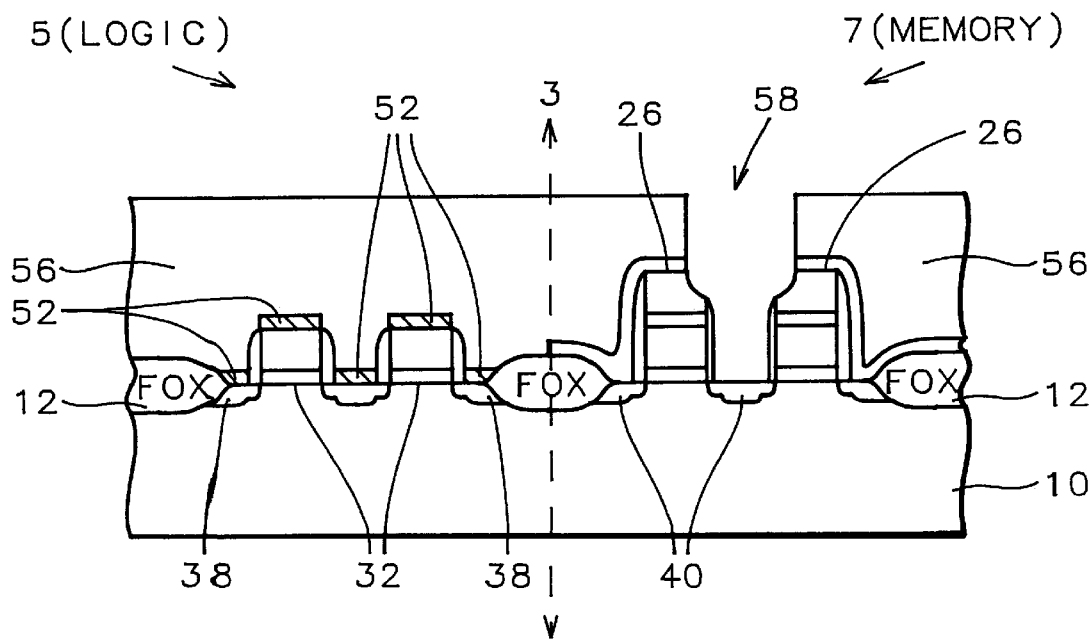

This completes the salicide process for the logic circuits. Now, the self-aligned contact in the memory circuit will be formed. Referring now to FIG. 13, a layer of interpoly oxide 56 is deposited over the substrate to a thickness of between about 3000 and 6000 Angstroms. The interpoly oxide may be plasma-enhanced (PE) oxide, PE tetraethoxysilane (TEOS), low pressure TEOS, etc. Conventional photolithography and etching are used to form the self-aligned contact opening 58.

Figure 14:
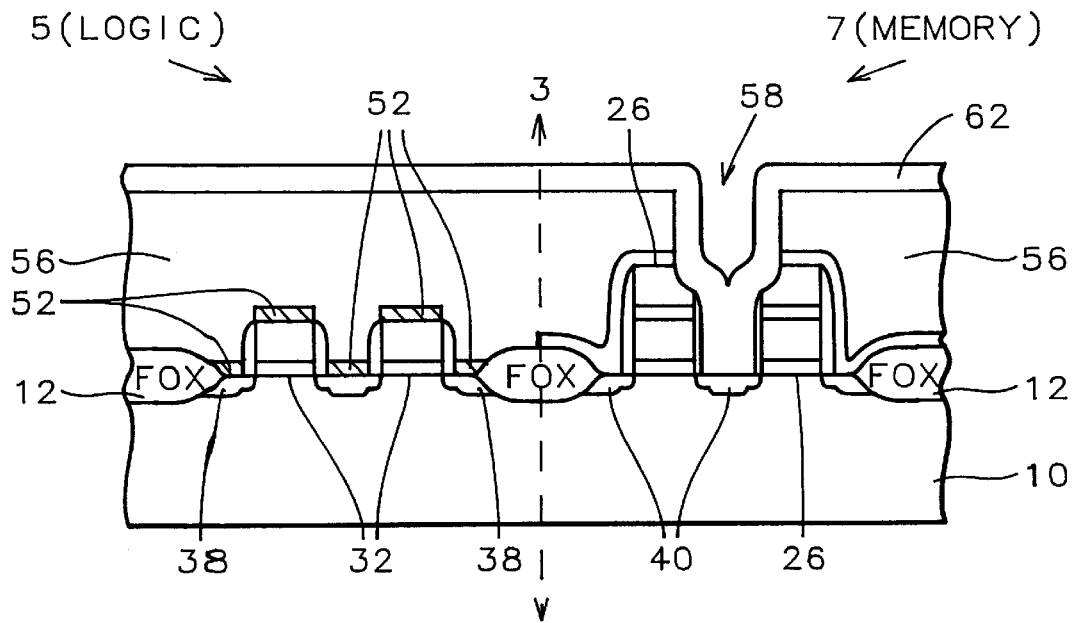
Figure 15:
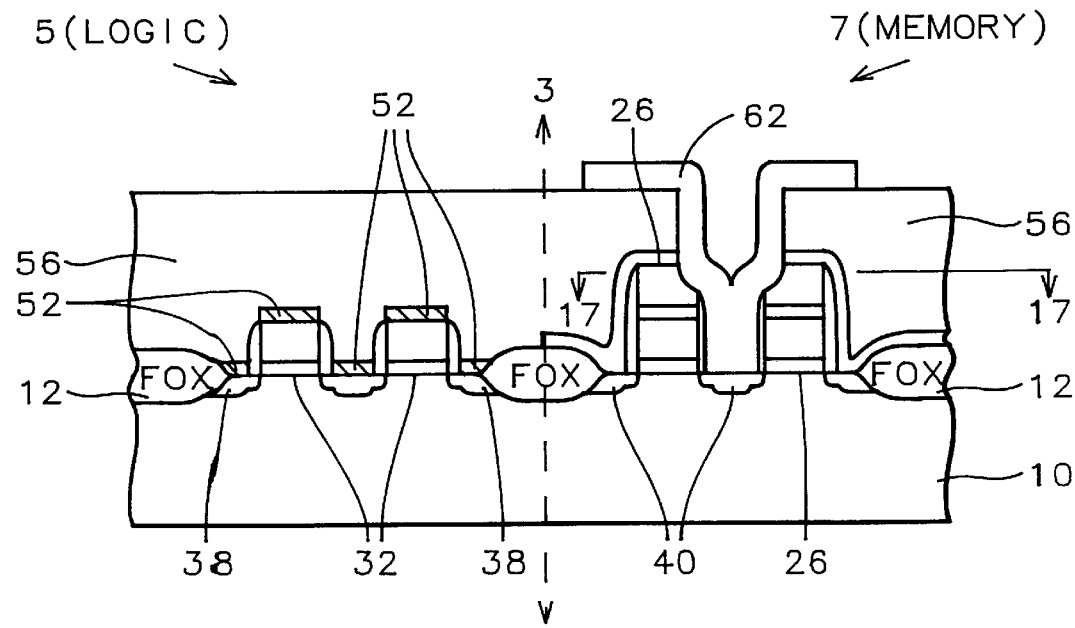

Referring to FIG. 14, a second polysilicon layer 62 is deposited over the surface of the substrate and within the contact opening 58. The polysilicon layer 62 is patterned to form the contact of the memory cell, as illustrated in FIG. 15. The self-aligned contact 62 forms a portion of a charge node or the contact of a bit line to the substrate if the memory cell is a DRAM. For an SRAM memory cell, 62 forms the contact of the $V_{ss}$ line to the substrate.

Figure 16:
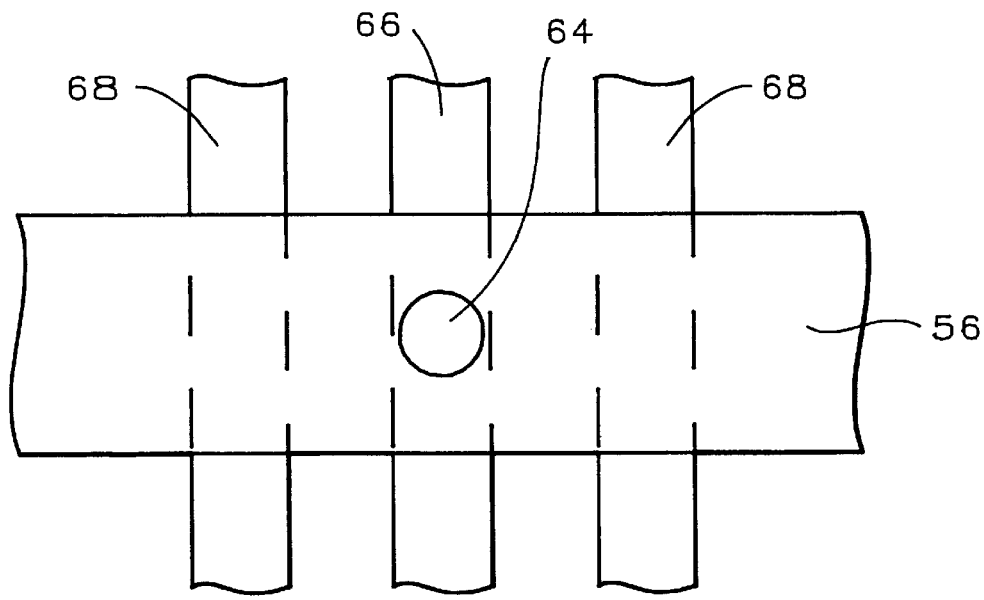
FIG. 16 is a top-view of a memory device of the prior art.
Figure 17:
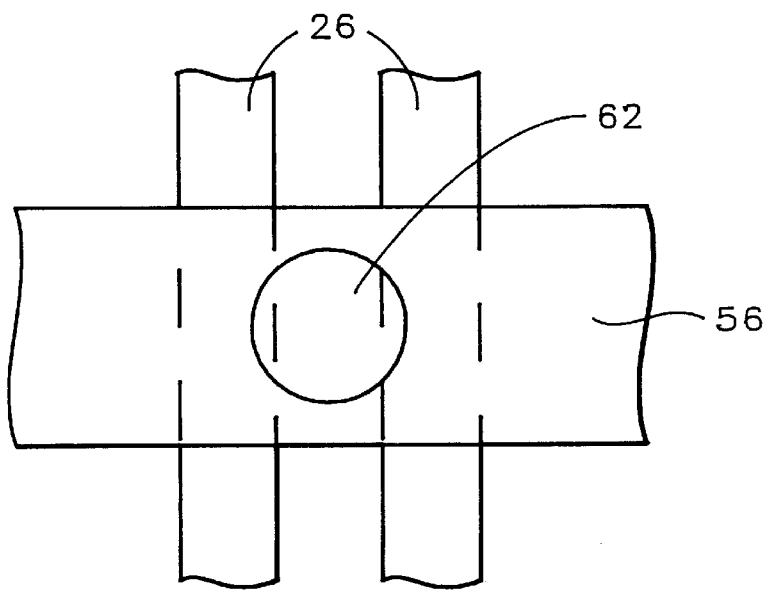
FIG. 17 is a top view of view 17—17 of FIG. 15 of the present invention.

FIG. 16 is a top view of the memory portion of an integrated circuit device of the prior art. The contact 64 is shown contacting bit line 66 between word lines 68. FIG. 17 is a top-view of the memory portion of an integrated circuit device of the present invention. Self-aligned contact 62 is shown contacting the source/drain region 40 (in view 17—17 of FIG. 15) between the word lines 26. It can be seen that in the process of the present invention, the word line pitch, or spacing, can be much tighter than in the prior art.

The process of the present invention integrates the salicide process for logic circuits with the self-aligned contact process for memory circuits so that memory and logic devices can be fabricated together on the same wafer. The process of the invention results in high performance logic circuits and high density memory cells. Salicide and self-aligned contact processes are integrated successfully on one chip.

While the invention has been particularly shown and described with reference to the preferred embodiments thereof, it will be understood by those skilled in the art that various changes in form and details may be made without departing from the spirit and scope of the invention.

What is claimed is:

1. A method of fabricating an integrated circuit device comprising:

forming field oxide areas on a semiconductor substrate surrounding and electrically isolating device areas, said device areas being a logic device area and a memory device area;

providing a gate oxide layer in said device areas;

depositing a first polysilicon layer overlying said gate oxide layer and said field oxide areas;

depositing a layer of silicon oxide overlying said polysilicon layer;

depositing a silicon nitride layer overlying said silicon oxide layer;

selectively removing said silicon nitride layer in said logic device area;

patterning said silicon nitride layer, said silicon oxide layer and said polysilicon layer in said memory device area to form memory devices;

patterning said first polysilicon layer in said logic device area to form gate electrodes;

implanting first ions to form lightly doped source and drain regions within said semiconductor substrate associated with said memory devices and said gate electrodes;

forming silicon nitride spacers on the sidewalls of said gate electrodes and said memory devices;

implanting second ions to form heavily doped source and drain regions within said semiconductor substrate associated with said gate electrodes and said memory devices;

covering said gate electrodes and said memory devices with a layer of resist protective oxide;

removing said resist protective oxide layer within said logic device area;

thereafter depositing a layer of titanium over said semiconductor substrate;

annealing said semiconductor substrate whereby said titanium layer is transformed into a titanium silicide layer over said gate electrodes and over said heavily doped source and drain regions associated with said gate electrodes;

removing said titanium layer which is not transformed into titanium silicide overlying said spacers, said field oxide regions, and said resist protective oxide layer to leave said titanium silicide layer only on the top surface of said gate electrodes and on the top surface of said semiconductor substrate overlying said heavily doped source and drain regions associated with said gate electrodes in said logic device area;

depositing an insulating layer over the surface of said semiconductor substrate;

forming a self-aligned contact opening in said memory device area through said insulating layer and said resist protective oxide layer between two of said memory devices to one of said heavily doped source and drain regions associated with said memory devices;

depositing a second polysilicon layer over said semiconductor substrate and within said self-aligned contact opening and patterning said second polysilicon layer to complete said self-aligned contact.

2. The method according to claim 1 wherein said resist protective oxide layer has a thickness of between about 200 and 400 Angstroms and wherein said resist protective oxide prevents silicidation from occurring in said memory device area.

3. The method according to claim 1 wherein said titanium layer comprises titanium nitride.

4. The method according to claim 1 wherein said titanium layer comprises titanium and titanium nitride.

5. The method according to claim 1 wherein said titanium layer is deposited to a thickness of between about 200 and 500 Angstroms.

6. The method according to claim 1 wherein said annealing is a rapid thermal anneal (RTA) performed in a nitrogen ambient at a temperature of between about 650 and 750° C. for between about 10 to 30 seconds.

7. The method according to claim 1 further comprising a second annealing after said step of removing said unreacted titanium wherein said second anneal ing transforms said titanium silicide into a lower resistance phase.

8. The method according to claim 7 wherein said second annealing is a rapid thermal anneal (RTA) performed in a nitrogen ambient at a temperature of between about 800 and 900° C. for between about 10 to 30 seconds.

9. A method of fabricating an integrated circuit device wherein a logic device area and a memory device area are fabricated on the same wafer comprising:

forming field oxide areas on a semiconductor substrate surrounding and electrically isolating said device areas, said device areas being said logic device area and said memory device area;

providing a gate oxide layer in said device areas;

depositing a first polysilicon layer overlying said gate oxide layer and said field oxide areas;

depositing a layer of silicon oxide overlying said polysilicon layer;

depositing a silicon nitride layer overlying said silicon oxide layer;

selectively removing said silicon nitride layer in said logic device area;

patterning said silicon nitride layer, said silicon oxide layer, and said polysilicon layer in said memory device area to form memory devices;

patterning said first polysilicon layer in said logic device area to form gate electrodes;

implanting first ions to form lightly doped source and drain regions within said semiconductor substrate associated with said memory devices and said gate electrodes;

forming silicon nitride spacers on the sidewalls of said gate electrodes and said memory devices;

implanting second ions to form heavily doped source and drain regions within said semiconductor substrate associated with said gate electrodes and said memory devices;

covering said gate electrodes and said memory devices with a layer of resist protective oxide;

selectively removing said resist protective oxide layer within said logic device area;

thereafter depositing a layer of titanium over said semiconductor substrate;

first annealing said semiconductor substrate whereby said titanium layer is transformed into a titanium silicide layer over said gate electrodes and over said heavily doped source and drain regions associated with said gate electrodes and wherein said titanium layer overlying said spacers, said field oxide regions, and said resist protective oxide layer is unreacted;

removing said unreacted titanium layer overlying said spacers, said field oxide regions, and said resist protective oxide layer to leave said titanium silicide layer only on the top surface of said gate electrodes and on the top surface of said semiconductor substrate overlying said heavily doped source and drain regions associated with said gate electrodes;

second annealing said substrate whereby said titanium silicide is transformed into a lower resistance phase;

thereafter depositing an insulating layer over the surface of said semiconductor substrate;

forming a self-aligned contact opening in said memory device area through said insulating layer and said resist protective oxide layer between two of said memory devices to one of said heavily doped source and drain regions associated with said memory devices;

depositing a second polysilicon layer over said semiconductor substrate and within said self-aligned contact opening and patterning said second polysilicon layer to complete said self-aligned contact.

10. The method according to claim 9 wherein said resist protective oxide layer has a thickness of between about 200 and 400 Angstroms and wherein said resist protective oxide prevents silicidation from occurring in said memory device area.

11. The method according to claim 9 wherein said titanium layer comprises titanium nitride.

12. The method according to claim 9 wherein said titanium layer comprises titanium and titanium nitride.

13. The method according to claim 9 wherein said titanium layer is deposited to a thickness of between about 200 and 500 Angstroms.

14. The method according to claim 9 wherein said first annealing is a rapid thermal anneal (RTA) performed in a nitrogen ambient at a temperature of between about 650 and 750° C. for between about 10 to 30 seconds.

15. The method according to claim 9 wherein said second annealing is a rapid thermal anneal (RTA) performed in a nitrogen ambient at a temperature of between about 800 and 900° C. for between about 10 to 30 seconds.

* * * * *